(12) United States Patent
Min

(10) Patent No.: US 9,728,562 B2
(45) Date of Patent: Aug. 8, 2017

(54) MANUFACTURING METHOD AND APPARATUS OF LOW TEMPERATURE POLYCRYSTALLINE SILICON, AND POLYCRYSTALLINE SILICON

(71) Applicant: BOE TECHNOLOGY GROUP CO., LTD., Beijing (CN)

(72) Inventor: Jian Min, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/088,296

(22) Filed: Apr. 1, 2016

(65) Prior Publication Data
US 2016/0336358 A1    Nov. 17, 2016

(30) Foreign Application Priority Data

May 11, 2015 (CN) .......................... 2015 1 0236924

(51) Int. Cl.
*H01L 21/02* (2006.01)
*H01L 27/12* (2006.01)

(52) U.S. Cl.
CPC .... *H01L 27/1285* (2013.01); *H01L 21/02592* (2013.01); *H01L 21/02675* (2013.01); *H01L 21/02678* (2013.01); *H01L 21/02691* (2013.01)

(58) Field of Classification Search
CPC ......... H01L 21/02365; H01L 21/02518; H01L 21/02683; H01L 21/2683
See application file for complete search history.

(56) References Cited

U.S. PATENT DOCUMENTS

2004/0263703 A1* 12/2004 You ................... G02F 1/136277
                                                              349/42
2005/0169330 A1    8/2005 Hongo
2006/0176920 A1    8/2006 Park

FOREIGN PATENT DOCUMENTS

CN        1521806 A        8/2004
CN        1577022 A        2/2005

OTHER PUBLICATIONS

First Chinese Office Action dated May 3, 2017.

* cited by examiner

*Primary Examiner* — Cheung Lee
(74) *Attorney, Agent, or Firm* — Dilworth & Barrese, LLP.; Michael J. Musella

(57) ABSTRACT

A manufacturing method and apparatus of low temperature polycrystalline silicon, and a polycrystalline silicon are provided. The manufacturing method of low temperature polycrystalline silicon includes forming an amorphous silicon layer on a substrate; scanning the amorphous silicon layer by using a laser to emit a strip-shaped laser beam to go through a mask which includes transmissive stripes and partially-transmissive stripes arranged alternately, to form low temperature fusion regions and high temperature fusion regions which are arranged alternately on the amorphous silicon layer; recrystallizing the amorphous silicon layer from the low temperature fusion regions to the high temperature fusion regions.

11 Claims, 2 Drawing Sheets

MANUFACTURING METHOD AND APPARATUS OF LOW TEMPERATURE POLYCRYSTALLINE SILICON, AND POLYCRYSTALLINE SILICON

TECHNICAL FIELD

Embodiments of the present disclosure relate to a manufacturing method and apparatus of low temperature polycrystalline silicon, and polycrystalline silicon.

BACKGROUND

Compared with an amorphous-silicon Thin Film Transistor (a-Si TFT), a technology of low temperature polycrystalline silicon has many advantages, such as a high mobility which is between 10 and 100 cm$^2$/Vs, meanwhile capability of being manufactured at low temperature (less than 600° C.), and being adapted from flexibly chosen substrate, and thus is currently the only active layer manufacturing technology that can be compatible with a flexible display technology. But now the technology currently adopts a strip laser beam to scan, and polycrystalline silicon using a temperature difference between adjacent scanning lines during the scanning process. Although such method can produce a relatively uniform polycrystalline silicon thin film, a slow scanning speed restricts manufacturing of large-area displays, and meanwhile production efficiency is low, and production cost is increased.

SUMMARY

One embodiment of the present disclosure provides A manufacturing method of low temperature polycrystalline silicon, comprising: forming an amorphous silicon layer on a substrate; scanning the amorphous silicon layer by using a laser to emit a strip-shaped laser beam to go through a mask which includes transmissive stripes and partially-transmissive stripes arranged alternately, to form low temperature fusion regions and high temperature fusion regions which are arranged alternately on the amorphous silicon layer; recrystallizing the amorphous silicon layer from the low temperature fusion regions to the high temperature fusion regions.

Another embodiment of the present embodiment provides a polycrystalline silicon, manufactured by using the manufacturing method as mentioned above.

Another embodiment of the present disclosure provides a manufacturing apparatus of low temperature polycrystalline silicon, comprising: a base, having a bearing platform configured to carry a substrate; a bracket, disposed on the base, and provided with a moving mechanism being capable of moving upon being driven by a control instruction; a laser, configured to emit a strip-shaped laser beam, disposed on the moving mechanism, and being capable of moving upon being driven by the moving mechanism; and a mask holder, disposed between the bearing platform and the laser, and used for arranging the mask.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
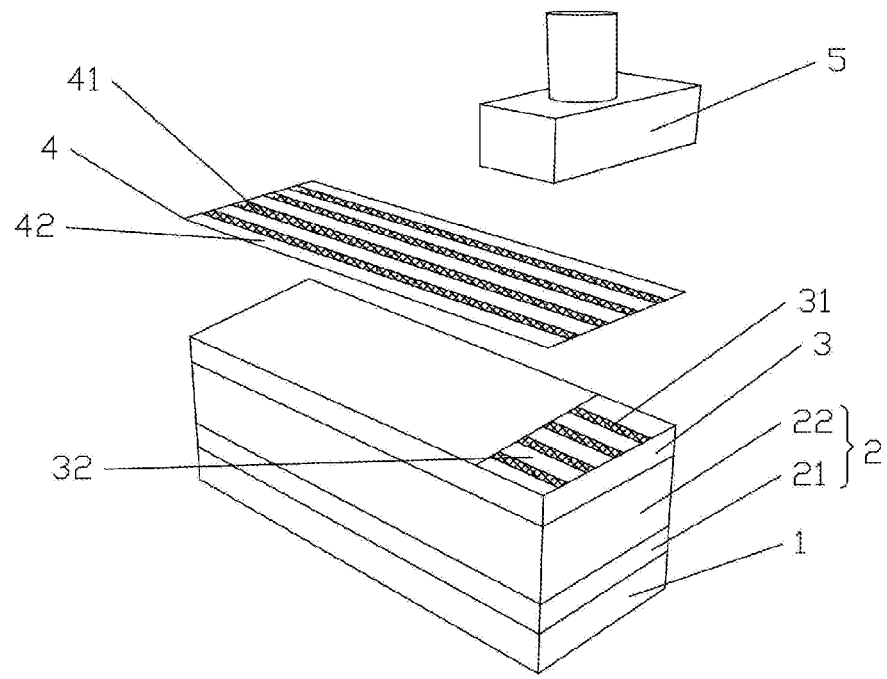
FIG. 1 is a schematic diagram of a manufacturing method of low temperature polycrystalline silicon provided by an embodiment of the disclosure.

Referring to FIG. 1, a manufacturing method of low temperature polycrystalline silicon provided by an embodiment of the disclosure, includes steps of: S1: forming an amorphous silicon layer 3 on a substrate 1; S2: scanning the amorphous silicon layer 3 by using a laser to emit a strip-shaped laser beam to go through a mask 4 which has an exposure pattern that includes partially-transmissive stripes 41 and transmissive stripes 42 arranged alternately, to form low temperature fusion regions 31 and high temperature fusion regions 32 which are arranged alternately on the amorphous silicon layer 3; S3: recrystallizing the amorphous silicon layer from the low temperature fusion regions 31 to the high temperature fusion regions 32.

Herein, the strip-shaped laser beam refers to that a cross-section of the beam taken along a direction perpendicular to a transmission direction of the beam has a shape of strip.

In some embodiments, step S1 can include:

S11: forming a buffer layer 2 on a surface of the substrate 1. The buffer layer 2 includes a silicon nitride (SiNx) layer 21 and a silicon oxide (SiOx) layer 22, and a total thickness of the silicon nitride layer 21 and the silicon oxide layer 22 is in a range from 2000 Å to 3000 Å. In the embodiment, a substrate 1 is provided, which is a glass substrate or a printed-circuit board. The silicon nitride layer 21 is firstly formed on a surface of the substrate 1 by plasma enhanced chemical vapor deposition, and a thickness of the silicon nitride layer 21 is, for example, 1000 Å, 1200 Å or 1500 Å; the silicon oxide layer 22 is formed on a surface of the silicon nitride layer 21 by plasma enhanced chemical vapor deposition, and a thickness of the silicon oxide layer 22 is, for example, 1000 Å, 1200 Å or 1500 Å.

S12: forming the amorphous silicon layer 3 on the buffer layer 2. For example, the amorphous silicon layer 3 is formed on the silicon oxide layer 22 by plasma enhanced chemical vapor deposition, and a thickness of the amorphous silicon layer 3 is in a range from 300 Å to 1000 Å, for example, 300 Å, 500 Å, 700 Å, and 1000 Å.

S13: performing dehydrogenation annealing treatment on the buffer layer 2 and the amorphous silicon layer 3. For example, dehydrogenation annealing is performed for 140 to 160 minutes at a temperature in a range from 380° C. to 420° C. In the embodiment, for example, dehydrogenation annealing is performed for 150 minutes at a temperature of 400° C., and it also can be performed for 160 minutes at a temperature of 380° C. or be performed for 140 minutes at a temperature of 420° C.

Figure 2:
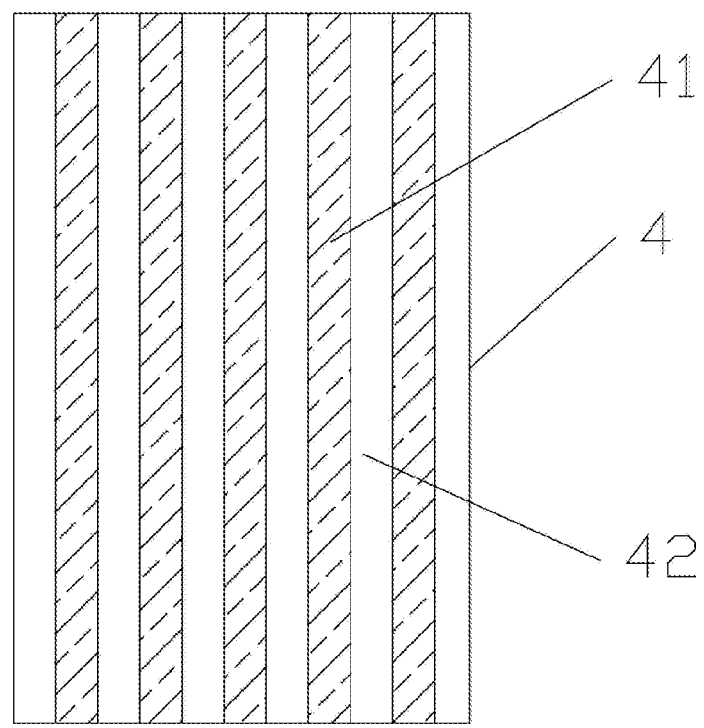
FIG. 2 is a mask of the manufacturing method of low temperature polycrystalline silicon provided by the embodiment of the disclosure.

In some embodiments, step S2 includes:

S21: arranging the mask 4 in parallel above the amorphous silicon layer 3 that needs to be recrystallized. Herein, arranging in parallel refers to that the mask 4 is parallel to the surface of the substrate 1. For example, a body of the mask 4 can be a transparent thin board made of transparent material, and an exposure pattern is formed on the transparent thin board and includes a plurality of transmissive stripes 42 and a plurality of partially-transmissive stripes 41 arranged alternately. For example, extending directions of the plurality of transmissive stripes 42 and the plurality of partially-transmissive stripes 41 are parallel to each other. In the embodiment, the partially-transmissive stripes 41 are a plurality of grey partially-transmissive stripes arranged alternatively as illustrated in FIG. 2, the partially-transmissive stripes 41 are formed by adopting a stain to coat the transparent thin board, and the transmissive stripes 42 are formed in a region except the partially-transmissive stripes 41, and the embodiments of the disclosure can control a grain size and an arranging method by changing the partially-transmissive stripes 41 on the mask. For example, a laser transmissivity of the partially-transmissive stripes 41 is between 50% and 65%, that is, 50% to 65% of laser that irradiates thereon can pass through it. From example, a laser transmissivity of the transmissive stripes 42 is 90% or more.

S22: scanning the amorphous silicon layer 3 by using the laser 5 to emit a strip-shaped laser beam to go through the mask 4 from a top thereof, to form the low temperature fusion regions 31 and the high temperature fusion regions 32 on the amorphous silicon layer 3. For example, a central axis along the transmission direction of the strip-shaped laser beams is perpendicular to the surface of the substrate 1, but the embodiment of the disclosure is not limited to this. The laser 5 is installed on a moving mechanism, and moves upon being driven by the moving mechanism. Before recrystallization, locations of the laser 5 and the mask 4 are adjusted properly, so that an area of the exposure pattern of the mask 4 is corresponding to an area of the amorphous silicon layer 3 that need to be recrystallized, the stripe-shaped laser beam emitted by the laser 5 is perpendicular to the exposure pattern, and a moving direction of the laser 5 coincides with the extending direction of the transmissive stripes 42. That is, as illustrated in FIG. 1, in the scanning process, the stripe-shaped laser beam exited from a laser head 53 are perpendicular to the transmissive stripes 42 or the partially-transmissive stripes 41, the amorphous silicon layer 3 is scanned movably along a length direction of the transmissive stripes 42 or the partially-transmissive stripes 41, and the low temperature fusion regions 31 and the high temperature fusion regions 32 arranged alternately are formed on the amorphous silicon layer 3. The laser 5 in the embodiment uses a xenon chloride laser, which emits laser beams with a wavelength of 308 nm, and a pulse width in a range from 10 ns to 50 ns. For example, the strip shape of the cross-section of the laser beam has an extension direction perpendicular to the extension direction of the transmissive stripes 42 or the partially-transmissive stripes 41.

As illustrated in FIG. 1, in the embodiment, a scanning speed is controlled, so that a duration for which laser radiates on any point of the amorphous silicon layer 3 is controlled for about 90 ns; after the pulse ends, the low temperature fusion regions 31 are recrystallized first, then the high temperature fusion regions are recrystallized, so as to form a amorphous silicon layer. For example, dehydrogenation annealing treatment is performed on a rough amorphous silicon layer. In the embodiment, the strip-shaped laser beam is perpendicular to the all-transmissive stripes 42, so that a low temperature fusion region 31 and a high temperature fusion region 32 adjacent to each other have a same temperature difference at any adjacent points, which can better control the recrystallization process.

In the manufacturing method of low temperature polycrystalline silicon provided by the embodiment of the present disclosure, the amorphous silicon layer is scanned by adopting the laser to emit strip-shaped laser beams to go through the exposure pattern on the mask, to form the low temperature fusion regions and the high temperature fusion regions on the amorphous silicon layer, and both of the amorphous silicon on the low temperature fusion regions and the high temperature fusion regions are completely melted, but the amorphous silicon on the low temperature fusion regions and the high temperature fusion regions have a temperature difference due to the function of alternately dark and bright stripes of the exposure pattern on the mask. When the laser pulse ends, the amorphous silicon on the low temperature fusion regions are crystallized first, then proceeds to the high temperature fusion regions, which thus can form a size-controllable and uniform amorphous silicon layer; this method can advance production efficiency greatly and improve the scanning time from seconds to nanoseconds. The mask can be reused and has low production cost.

The disclosure further discloses polycrystalline silicon, which is made by the manufacturing method of low temperature polycrystalline silicon.

Figure 3:
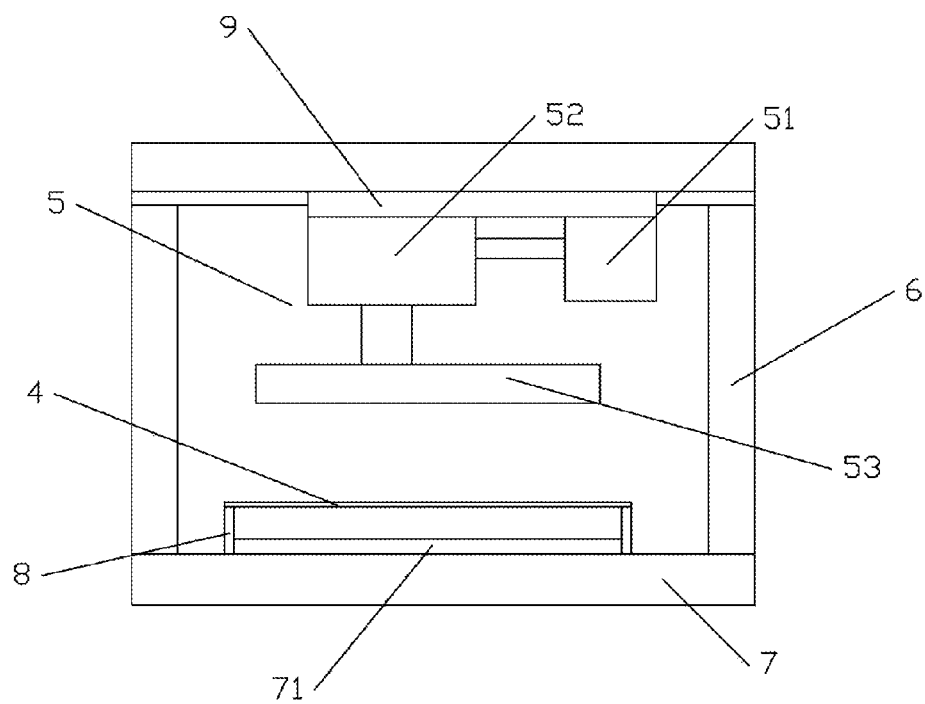
FIG. 3 is a structural diagram of a manufacturing apparatus of low temperature polycrystalline silicon provided by an embodiment of the disclosure.

Referring to FIG. 3, the disclosure further provides a manufacturing apparatus of low temperature polycrystalline silicon, which is applicable to the manufacturing method of low temperature polycrystalline silicon, including: a base 7, a bracket 6, a laser 5, and a mask holder 8. The base 7 has a bearing platform 71, and being used for carrying a substrate. The bracket 6 is disposed on the base 7; the bracket 6 is provided with a moving mechanism 9 which movies capable of moving upon being driven by a control instruction. The laser 5 is disposed on the moving mechanism 9 and can move upon being driven by the moving mechanism 9. In some embodiments, the laser 5 includes a laser source 51, a light conversion device 52, and a laser head 53; the light conversion device 52 has an input end thereof connected with the laser source 51, and an output end thereof connected with the laser head 53, and is configured to convert laser light that is generated by the laser source 51, and the strip-shaped laser beam exits from the laser head 53. The laser head 53 is located above the bearing platform 71, and an emergent surface of the laser head 53 is parallel to the bearing platform 71. For example, the emergent surface of the laser head is parallel to a surface of the bearing platform for carrying the substrate. The mask holder 8 is disposed above the bearing platform 71 and is used for arranging the mask 4, so that the mask 4 is arranged between the laser head 53 and the bearing platform 71; the laser scans the amorphous silicon layer 3 to go through the exposure pattern on the mask 4 to form the low temperature fusion regions and the high temperature fusion regions on the amorphous silicon layer 3. The mask 4 of the disclosure includes partially-transmissive stripes 41 and transmissive stripes 42. For example, the laser source 5 of the disclosure can be a xenon chloride laser source. It is a common technical structure in the art that the moving mechanism of the disclosure can adopt several methods often used in a mechanical field, such as, a linear slide rail, a combination of ball screw and servo motor, or a combination of linear slide rail and air cylinder, which will not be repeated.

The manufacturing apparatus of low temperature polycrystalline silicon provided by the disclosure, upon working, arranges the substrate 1 with the amorphous silicon layer 3 deposited thereon on the surface of the bearing platform 71, the laser head 53 emits the strip-shaped laser beam to go through the mask to scan the amorphous silicon layer 3, which makes the amorphous silicon layer 3 form molten state with different temperatures and be recrystallized, forming a regular amorphous silicon layer.

The foregoing embodiments merely are exemplary embodiments of the disclosure, and not intended to define the scope of the disclosure, and the scope of the disclosure is determined by the appended claims.

The present application claims priority of Chinese Patent Application No. 201510236924.6 filed on May 11, 2015, the disclosure of which is incorporated herein by reference in its entirety as part of the present application.

The invention claimed is:

1. A manufacturing method of low temperature polycrystalline silicon, comprising:
    forming an amorphous silicon layer on a substrate;
    scanning the amorphous silicon layer by using a laser to emit a strip-shaped laser beam to go through a mask which includes transmissive stripes and partially-transmissive stripes arranged alternately, to form low temperature fusion regions and high temperature fusion regions which are arranged alternately on the amorphous silicon layer; and
    recrystallizing the amorphous silicon layer from the low temperature fusion regions to the high temperature fusion regions.

2. The manufacturing method of low temperature polycrystalline silicon according to claim 1, wherein, during the scanning, the strip-shaped laser beam is perpendicular to the transmissive stripes.

3. The manufacturing method of low temperature polycrystalline silicon according to claim 1, wherein, the transmissive stripes and the partially-transmissive stripes are parallel to each other.

4. The manufacturing method of low temperature polycrystalline silicon according to claim 1, wherein, forming the amorphous silicon layer on a substrate includes:
    forming a buffer layer on a surface of the substrate;
    forming the amorphous silicon layer on the buffer layer; and
    performing dehydrogenation annealing treatment on the buffer layer and the amorphous silicon layer.

5. The manufacturing method of low temperature polycrystalline silicon according to claim 4, wherein, forming the buffer layer on the surface of the substrate includes:
    forming a silicon nitride layer and a silicon oxide layer sequentially on the surface of the substrate.

6. The manufacturing method of low temperature polycrystalline silicon according to claim 5, wherein, a total thickness of the silicon nitride layer and the silicon oxide layer is in a range from 2000 Å to 3000 Å; and a thickness of the amorphous silicon layer is in a range from 300 Å to 1000 Å.

7. The manufacturing method of low temperature polycrystalline silicon according to claim 4, wherein, the buffer layer and the amorphous silicon layer are formed by plasma enhanced chemical vapor deposition.

8. The manufacturing method of low temperature polycrystalline silicon according to claim 4, wherein, the dehydrogenation annealing is performed for 140 to 160 minutes at a temperature in a range from 380° C. to 420° C.

9. The manufacturing method of low temperature polycrystalline silicon according to claim 1, wherein, scanning the amorphous silicon layer by using the laser to emit the strip-shaped laser beam to go through the mask which includes the transmissive stripes and the partially-transmissive stripes arranged alternately to form the low temperature fusion regions and the high temperature fusion regions which are arranged alternately on the amorphous silicon layer includes:
    arranging the mask above the amorphous silicon layer that needs to be recrystallized, so that the mask is parallel to a surface of the substrate;
    scanning the amorphous silicon layer by using the laser to emit the strip-shaped laser beam to go through the mask from a top thereof, to form the low temperature fusion regions and the high temperature fusion regions on the amorphous silicon layer.

10. The manufacturing method of low temperature polycrystalline silicon according to claim 9, wherein, a wave length of the laser beam is 308 nm, and a pulse width thereof is in a range from 10 ns to 50 ns.

11. The manufacturing method of low temperature polycrystalline silicon according to claim 1, wherein, a laser transmissivity of the partially-transmissive stripe laser is in a range from 50% to 65%.

* * * * *